(12) United States Patent
Xue et al.

(10) Patent No.: US 7,136,306 B2
(45) Date of Patent: Nov. 14, 2006

(54) SINGLE BIT NONVOLATILE MEMORY CELL AND METHODS FOR PROGRAMMING AND ERASING THEREOF

(75) Inventors: Gang Xue, Leuven (BE); Jan Van Houdt, Bekkevoort (BE)

(73) Assignee: Interuniversitair Microelektronica Centrum (IMEC), Leuven (BE)

(*) Notice: Subject to any disclaimer, the term of this patent is extended or adjusted under 35 U.S.C. 154(b) by 146 days.

(21) Appl. No.: 10/680,878

(22) Filed: Oct. 7, 2003
(Under 37 CFR 1.47)

(65) Prior Publication Data

US 2004/0233694 A1 Nov. 25, 2004

Related U.S. Application Data

(60) Provisional application No. 60/416,610, filed on Oct. 7, 2002.

(51) Int. Cl.
*G11C 16/04* (2006.01)
*G11C 5/06* (2006.01)

(52) U.S. Cl. ............ 365/185.28; 365/185.03; 365/185.05; 365/185.27; 365/72

(58) Field of Classification Search .......... 365/185.18, 365/185.27, 185.28, 185.29, 185.05
See application file for complete search history.

(56) References Cited

U.S. PATENT DOCUMENTS

| 4,375,087 | A | * | 2/1983 | Wanlass | 365/218 |
|---|---|---|---|---|---|
| 5,615,147 | A | * | 3/1997 | Chang et al. | 365/185.3 |
| 5,768,192 | A | * | 6/1998 | Eitan | 365/185.24 |
| 5,838,617 | A | * | 11/1998 | Bude et al. | 365/185.18 |
| 6,058,043 | A | * | 5/2000 | Houdt et al. | 365/185.14 |
| 6,528,845 | B1 | * | 3/2003 | Bude et al. | 257/324 |
| 6,653,682 | B1 | * | 11/2003 | Houdt et al. | 257/315 |
| 6,734,490 | B1 | * | 5/2004 | Esseni et al. | 257/315 |
| 6,850,440 | B1 | * | 2/2005 | Lin et al. | 365/185.18 |
| 6,865,112 | B1 | * | 3/2005 | Kawai et al. | 365/185.22 |
| 6,885,587 | B1 | * | 4/2005 | Yang et al. | 365/185.18 |

FOREIGN PATENT DOCUMENTS

| EP | 1096572 A1 | 10/2000 |
|---|---|---|
| EP | 1074995 | 2/2001 |
| WO | WO9748099 | 12/1997 |
| WO | WO0147019 | 6/2001 |

OTHER PUBLICATIONS

"CHISEL Flash EEPROM—Part 1: Performance and Scaling", Souvik Mahapatra, S. Shukuri, Jeff Bude, IEEE Transactions On Electron Devices, vol. 49, No. 7, Jul. 2002.

(Continued)

*Primary Examiner*—Amir Zarabian
*Assistant Examiner*—Ly Duy Pham
(74) *Attorney, Agent, or Firm*—McDonnell Boehnen Hulbert & Berghoff LLP

(57) ABSTRACT

A method for programming a single bit nonvolatile memory cell integrated on a metal-dielectric-semiconductor technology chip. The memory cell comprises a semiconductor substrate including a source, a drain, and a channel in-between the source and the drain. The memory cell further comprises a control gate that comprises a gate electrode and a dielectric stack. The gate electrode is separated from the channel by the dielectric stack. Further, the dielectric stack comprises at least one charge storage dielectric layer. The method for programming the memory cell comprises applying electrical ground to the source, applying a first voltage having a first polarity to the drain, applying a second voltage of the first polarity to the control gate; and applying a third voltage having a second polarity opposite to the first polarity to the semiconductor substrate.

2 Claims, 8 Drawing Sheets

OTHER PUBLICATIONS

Austrian Search Report of Application No. 200305836-9 for Infineon Technologies AG, mailed May 24, 2004.

Austrian Examination Report of Application No. 20030586-9, mailed May 24, 2004.

* cited by examiner

SINGLE BIT NONVOLATILE MEMORY CELL AND METHODS FOR PROGRAMMING AND ERASING THEREOF

CROSS REFERENCE TO RELATED APPLICATIONS

This application claims priority benefits under 35 U.S.C. § 119(e) to U.S. Provisional Patent Application No. 60/416,610, filed on Oct. 7, 2002. The entire disclosure of U.S. Provisional Patent Application No. 60/416,610 is herein incorporated by reference.

FIELD

The present invention relates generally to electrically programmable and erasable memory (EEPROM or $E^2PROM$) devices and, more particularly, to single gate memory devices using a dielectric layer for locally storing and retaining injected charge and methods for programming such memory devices.

BACKGROUND

Flash EEPROM memory devices comprise the largest class of electrically alterable, nonvolatile semiconductor memories. They also represent the fastest growing segment of semiconductor memories, offering high integration densities and fast read access times. Flash EEPROM devices are electrically written and erased, and allow for effectively permanent data storage. Typical flash EEPROM memories offer the ability to erase all memory cells in the device simultaneously, or to erase of selected groups of the memory cells simultaneously.

Flash devices operate by storing electrical charge on a floating gate structure. This stored charge modulates the conductance of a metal-oxide semiconductor (MOS) transistor channel underneath it. The floating gate is electrically insulated from its surroundings by a high quality dielectric, such as $SiO_2$. A control gate that is capacitively coupled to the floating gate is used to modulate the electrical potential of the floating gate. The floating gate is formed from a conductive material such as polycrystalline silicon, which allows injected (stored) charge to be distributed over substantially the whole area of the conductive floating gate.

Alternatively a non-conductive material, such as nitride, can be used to store charge. Charge introduced into the non-conductive gate will, to a large extent, be confined to the place of introduction and, as a result, only a limited amount of charge is needed to program the memory cell. For example, PCT Patent Application WO 99/07000 discloses a two-bit non-volatile EEPROM cell using a nitride layer sandwiched in between top and bottom oxide layers. This memory cell is programmed using conventional channel-hot-electron-injection to inject electrons through the oxide and onto the nitride layer. Channel-hot-electron-injection requires the junction to overlap the nitride layer as the injection of the hot carriers occurs at the position of the maximum electrical field, which corresponds to the metallurgical junction between the drain and the well. Hence a sharp and well-controlled doping profile must be realized for such devices.

The symmetrical layout of the device allows, by appropriately selecting the voltages, electrons to be injected on either side of the non-conductive floating gate. Two bits of data can hence be stored, each bit on an opposite side of the floating gate. Erasing of the cell is done by removing the trapped electrons, through the top and/or the bottom electrode, using Fowler-Nordheim (FN) tunneling. The stored bits are read in "reverse direction." For example, the bit at the drain side is read (e.g., the shift in threshold voltage at this point, is measured) by grounding the drain and biasing the source and the gate voltage such that saturation is reached in the channel near the source. This saturation region will mask the influence of the charge, which is stored near the source. In the ideal case only the influence of the charge stored near the drain on the cell current is measured when reading the drain bit. Thus, the doping profile must not only be engineered to enable localized injection of carriers, but also to allow screening (preventing interference) of one bit when sensing the bit on the opposite side of such a two-bit cell.

For applications where flash memory is to be integrated with high performance logic circuitry, it is desirable that the voltages required for programming, reading or erasing the memory cells are compatible with the supply voltage of the logic circuitry the flash memory is integrated with. Otherwise, complex and area consuming charge pump circuits and high voltage circuits, which are, for example, used in the decoder circuitry, must be provided on chip to provide the internal or on-chip voltages needed to operate the flash memory. The scaling of transistor dimensions towards 0.35 micrometer and below will, however, result in a corresponding scaling down of the available supply voltage from 5V towards 3.3V and below. Thus, providing sufficient power to operate current flash memory cells becomes even more difficult when the supply voltage is scaled and the memory array density is increased, leaving less area for the column drivers. Furthermore the charge pump circuits, which generate, from the scaled supply voltage, the high operating voltages for programming and erasing, become less efficient and more area consuming as the supply voltage is decreased.

Using conventional channel-hot-electron-injection (CHE) requires a gate voltage of 8–9V or above. Such programming voltages are much higher than the supply voltages employed with submicron CMOS technologies. Some programming methods have been developed to reduce the required programming voltages. For example, S. Mahapatra, S. Shukuri and J. Bude et al disclose in "Chisel Flash EEPROM-Part1: Performance and scaling", IEEE Trans. Electron Devices, July 2002, pp. 1296–1301, a low-voltage programming technique using substrate-enhanced-hot-electron injection, also often referred to as CHISEL, to scale the gate voltage of a stacked gate memory cell down to 5–6V. The proposed device still requires higher programming voltages to attract electrical carriers towards the polysilicon floating gate, e.g. 8V at the control gate.

In European Patent Application EP 1,096,572, another low-voltage programming technique is disclosed. The approached described in this application employs the mechanism of drain-induced-secondary-impact-ionization for injecting hot electrons into the floating gate of a split-gate memory cell. Due to overlap of the floating gate over the drain junction, the drain voltage is capacitively coupled to the floating gate and assists in attracting the secondary electrons towards the floating gate. Such an approach, however, requires complicated drain engineering to produce such devices.

Although methods exist that somewhat lower the programming voltages employed, reduction of erase voltages is still troublesome. In this respect, using FN tunneling for erasing floating gate memory devices (as is common) requires the use of large electrical fields, as the dielectric layers electrically insulating the floating gate cannot be scaled (e.g., due to reliability concerns) to such an extent that the corresponding voltages are considerably lowered. Even when a negative voltage is applied to the gate, the voltages used during the step of erasing the memory cell are still above 6V due of the poor scalability of the top and bottom oxide layers through which the stored electrons must tunnel. Reliability concerns, such as moving bits (e.g., memory cells that do not retain stored charge) and stress induced leakage currents are typically considered when determining appropriate program and erase voltages.

SUMMARY

Exemplary memory devices and methods for programming such devices are disclosed herein. One embodiment of such a memory device that may be integrated on a chip produced using a complimentary metal-oxide semiconductor (CMOS) manufacturing process comprises a semiconductor substrate including a source, a drain, a channel in-between the source and the drain, a gate electrode is separated from the channel by a dielectric stack. The dielectric stack comprises at least one charge storing dielectric layer.

An exemplary method for programming a single bit, single gate, nonvolatile memory cell, such as the one just described, comprises biasing the source of the memory cell to ground, applying a first voltage of a first polarity to the drain of the cell, applying a second voltage of the first polarity to the gate, and applying a third voltage of an opposite polarity to the semiconductor substrate, the first, second and third voltages cooperatively effecting programming of the cell using electrical carriers produced by secondary-impact-ionization. The difference in the absolute values of the first, second and third voltages being applied respectively to the drain, gate and bulk during programming is 1.5V or less, or 1V or less. Further in the exemplary method, the absolute value of the first, second and third voltages being applied respectively to the drain, gate and bulk during programming are approximately the same value. This absolute value may be 5 V or less, or may be 4.5V or less.

An exemplary method for erasing a single bit, single gate nonvolatile memory cell, such as the cell described above, comprises biasing the source to ground, applying a first voltage of a first polarity to the drain of the memory device. The method further includes applying a second voltage of a second opposite polarity to the gate and applying a third voltage of the second opposite polarity to the semiconductor substrate. The first, second and third voltages cooperatively effect erasing of the cell using band-to-band-tunneling-induced-hot-carrier injection. The difference in absolute value between the first, second and third voltages being applied respectively to the drain, gate and bulk during erasing is 1.5V or less, or 1V or less. In the exemplary embodiment, the absolute value of the first, second and third voltages being applied, respectively, to the drain, gate and bulk during programming are approximately the same value. This absolute value may be 5 V or less, or may be 4.5V or less.

An exemplary embodiment of a memory array including a plurality of memory devices, such as those described above, is organized in columns. Adjacent memory cells in each column have either their drain or their source node in common. The drain nodes of two adjacent memory cells in each column are coupled to form a program line (PL) that runs perpendicular to the cell column. This PL is formed in a first interconnect layer of metal coupled, using contacts or vias, with the drain. The source nodes of the memory cells in each column are coupled to form a bit line (BL), running parallel to the corresponding cell column. For the exemplary embodiment, this BL is formed in a second, higher, interconnect layer of metal and is coupled, using contacts or vias, with the source. The gates of each memory cell at identical horizontal positions in each column are coupled by a word line (WL), running perpendicular to the cell column. For this embodiment, the WL is formed using the polycrystalline silicon used to form the gate electrode of each memory cell. Thus, in the exemplary array, word lines and program lines are arranged in parallel.

These as well as other advantages of various aspects of the present invention will become apparent to those of ordinary skill in the art by reading the following detailed description, with appropriate reference to the accompanying drawings.

BRIEF DESCRIPTION OF THE DRAWINGS

Exemplary embodiments of the present invention are described herein with reference to the drawings, in which.

DETAILED DESCRIPTION

Introduction

In the following detailed description, numerous specific details are set forth in order to provide a thorough understanding of the invention and how it may be practiced in particular embodiments. However, it will be understood that the present invention may be practiced without these specific details. In other instances, well-known methods, procedures and techniques have not been described in detail, so as not to obscure the present invention. While the present invention will be described with respect to particular embodiments and with reference to certain drawings, the invention is not limited thereto.

For purposes of this disclosure, the term "supply voltage" means a voltage potential used to supply power to any logic circuit on chip (e.g., fabricated with a CMOS technology) on which exemplary non-volatile memory cells are incorporated. Further, for purposes of this disclosure, any voltage potential generated externally from the chip other than the supply voltage (as defined above) will be referred to herein as an "external voltage". Still further for purposes of this disclosure, the term "internal voltage" means a voltage available on-chip, which is generated by charge pump circuits from the supply voltage.

Exemplary Memory Cell

Figure 1:
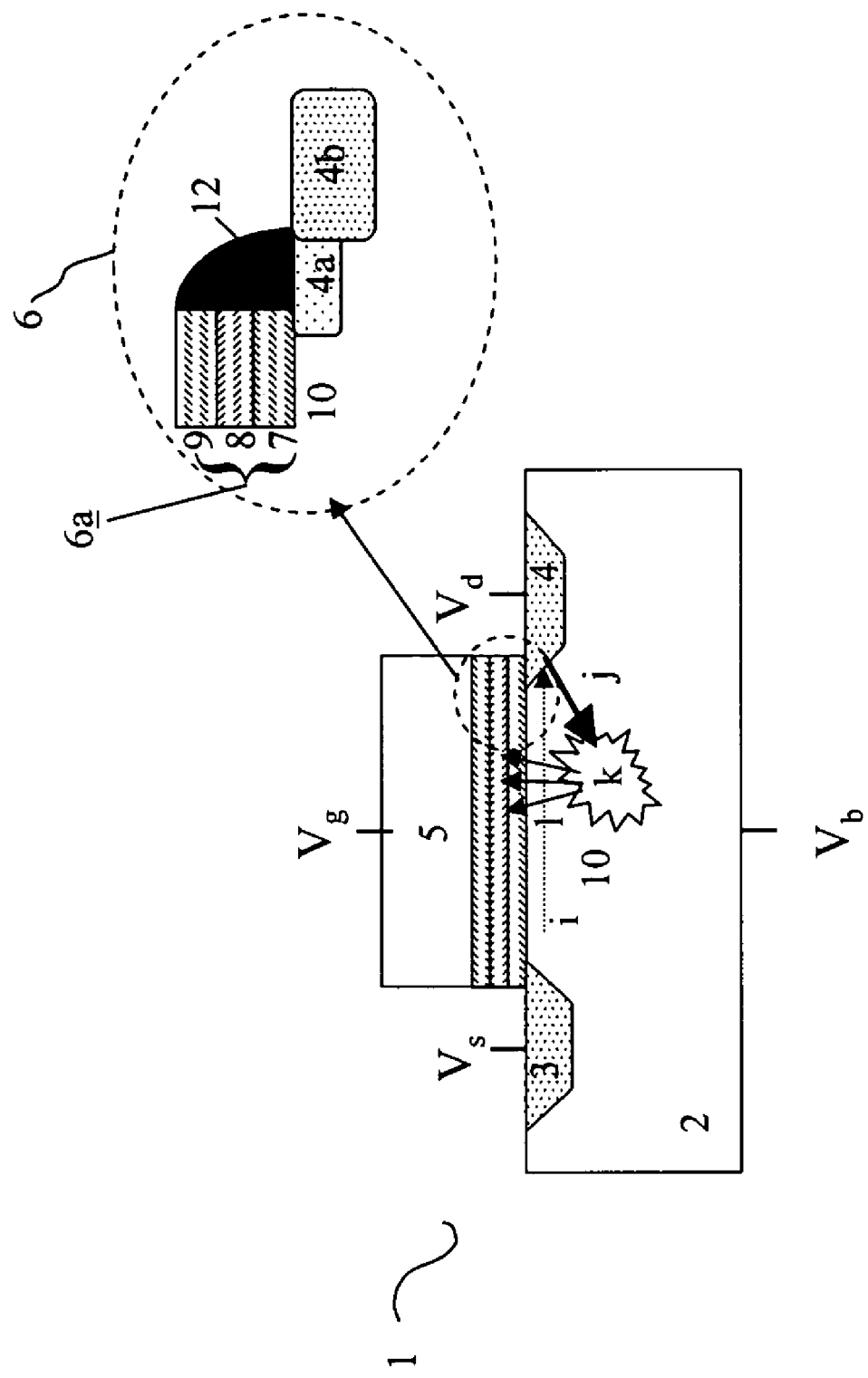
FIG. 1 is a schematic cross-sectional drawing illustrating a layout of a memory device in accordance with an embodiment of the invention.

Referring to FIG. 1, a cross-sectional layout of an exemplary single gate memory device 1 is shown. The memory device 1 comprises a semiconductor substrate 2 (e.g. a silicon wafer), a source 3 and a drain 4. The source 3 and the drain 4 are highly doped regions that are formed, and self-aligned to a single, conductive gate 5. The gate 5 is formed on a stack of dielectric layers 6a. It will be appreciated that the memory device 1 shown in FIG. 1, is substantially of the form of a complimentary-metal-oxide semiconductor (CMOS) field effect transistor (FET or MOSFET) typically implemented in such technologies. Therefore, the source 3 and drain 4 will effectively not overlap the gate 5 of the memory device 1.

As shown in the inset 6 of FIG. 1 (for the drain 4 side) a doped extension 4a (e.g. a lightly doped extension) is present underneath a spacer 12. The extension 4a forms a conductive path between a highly doped region 4b of the drain 4 and the channel 10, as is common practice in submicron CMOS technologies. It is noted that the source 3 and drain 4 are of a doping type opposite to the doping type of the substrate 2 or a well containing the memory device 1. For purpose of this disclosure, the embodiments discussed herein will be described with respect the use of an n-channel device, for which an n-type drain and n-type source are formed in a p-type substrate or a p-well. However, it will be appreciated that the methods, cell structures and arrays described herein also apply to embodiments employing a p-channel device. Although the device structure shown in FIG. 1 is symmetrical, the term "drain" is used to identify the side of the device from which the memory cell is programmed/erased.

The conductive gate 5 is used as a gate electrode to bias (e.g., and modulate the conductivity of) the underlying FET structure. The dielectric layer stack 6a underlies the gate 5 and acts as the gate dielectric of the FET structure (memory device) shown in FIG. 1. The stack 6a, for this particular embodiment, is a stack of a first dielectric layer 7, a second dielectric layer 8 and a third dielectric layer 9. The first and third dielectric layers (7 and 9) electrically insulate the second dielectric layer 8 from, respectively, the channel 10 and the conductive gate 5.

For the memory cell 1, the second dielectric layer 8 is used as a charge trapping or charge-storing layer. Therefore, the stack 6a of dielectric layers must be capable of receiving charge carriers that are injected from the channel 10. The injected charge carriers must be stored and retained with the second dielectric layer 8. In this regard, the second dielectric layer 8 may be a nitride layer, an oxide layer with buried separated poly-silicon islands (where the charge is stored within these conductive poly-silicon islands), a layer comprising separated silicon microcrystals (where the charge can be stored in these separated silicon microcrystals), a silicon-rich oxide layer, a high-k dielectric layer such as $HfO_2$, $Al_2O_3$ or $ZrO_2$, among any number of other possibilities.

The stack 6a of the dielectric layers 7, 8 and 9 may be formed by depositing the first dielectric layer 7 on top of a major surface of the semiconductor substrate 2. The first dielectric layer 7 typically comprises silicon dioxide formed by thermal oxidation of the silicon substrate 2, or can be deposited by a variety of chemical vapor deposition (CVD) techniques. Alternatively, a tetra-ethoxy-silane (TEOS) layer formed by Low. Pressure CVD, or oxides formed by Atomic Layer CVD) may be employed. The thickness of the first dielectric layer 7 may be between 3 nm and 20 nm, or between 3 nm and 10 nm. The second dielectric layer 8 is formed on top of the first dielectric 7, which electrically insulates the second dielectric 8 from the channel 10 underneath. For this particular embodiment, the second dielectric layer 8 comprises a silicon nitride layer with a thickness between 2 and 20 nm, or between 5 and 12 nm. The third dielectric layer 9 is formed on top of the second dielectric layer 8, e.g. by CVD, which electrically insulates the second dielectric layer 8 from the gate 5. For this embodiment, the third dielectric layer 9 comprises a silicon oxide having a thickness between 3 and 20 nm, or between 3 and 10 nm. Such a dielectric layer stack forms an ONO (oxide-nitride-oxide) stack. For this ONO stack, the second dielectric layer 8 (nitride layer) retains the charge used for programming the memory cell 1.

The conductive gate 5 is formed on top of the third dielectric layer 9. In the exemplary embodiment, the gate 5 is formed with polycrystalline silicon having a thickness ranging from 100 to 400 nanometer (nm). As is known, the memory cell 1 may be referred to as a single poly device. The conductive gate 5 is of the same doping type as the source 3 and drain 4.

An advantage of the exemplary memory cell 1 is that such devices may be manufactured using a MOSFET structure that is substantially intrinsic to CMOS manufacturing technologies. In this regard, the memory cell 1 comprises the gate 5, the source 3, the drain 4 and at least one dielectric layer separating the gate 5 from the channel 10 in-between the source 3 and drain 4, which are elements of a CMOS transistor. Thus, manufacturing the memory cell may only employ one additional masking step for a number of CMOS manufacturing technologies. This additional masking step would remove the layers of the dielectric stack 6a not used as the gate dielectric for the non-memory array areas (e.g., the second dielectric layer 8 and the third dielectric layer 9). After the formation of the dielectric stack 6a, the layer forming the gate 5, e.g. a polycrystalline layer, is deposited over the wafer. This gate electrode layer is patterned to form the gate of the logic devices as well as the gate of the memory cells. All other steps for forming the memory cell are typically included in the core CMOS manufacturing technology and, as such, are known by those skilled in this area. Those processing steps may then be performed to complete the MOSFET structures of both the logic and the memory portions of the chip.

Another advantage of the exemplary device is that such devices are not manufactured using elaborate junction engineering, which is needed in current devices to ensure, among other things, that sufficient localized hot carrier injection occurs during programming and/or erase. Such an approach is advantageous as it reduces manufacturing complexity and costs as well as manufacturing process research and development costs.

Discussed below are some experimental results that were obtained using exemplary memory devices, such as those discussed herein. Specifically, the experimental results discussed below were obtained using devices manufactured with a 0.18 um CMOS technology. The thickness of the individual layers for the ONO stack (e.g., the stack 6a) of these devices was 5.5 nm for the bottom oxide (the dielectric layer 7), 8.5 nm for the nitride layer (the dielectric layer 8), and 5.5 nm for the top oxide layer (the dielectric layer 9). The n-type source 3 and drain 4 had junction depths of 0.12 um deep and were formed in a retrograde well having a doping concentration of 3e17 cm². The memory cell size was 0.54 um² with a width to length ratio (W/L) of 0.25 um/0.18 um. It is noted that the methods as discussed herein may be applied to any number of non-volatile memory technologies that may be embedded in a CMOS technology, and are not limited to applications using devices such as those as described above.

Exemplary Method for Programming a Memory Cell

An exemplary method for programming a single gate non-volatile memory cell that comprises a charge-storing dielectric layer, such as described above, comprises programming the cell from the drain 4 side. This programming is accomplished by applying a first voltage of a first polarity to the drain 4, applying a second voltage of the first polarity to the gate 5, applying a third voltage of an opposite polarity to the substrate 2, and biasing the source 3 to 0 V or electrical ground. In this situation, primary carriers, electrons for this particular embodiment (e.g., the memory device 1 shown in FIG. 1), will then migrate from the source 3 through the channel 10 to the drain 4 (as indicated by the arrow i) and gain energy from the drain-source voltage. This creates electron-hole pairs as a result of a first impact ionization mechanism at or near the drain 4. As a result of the electron-hole creation "first-impact carriers", which are holes for this embodiment, will travel from the point of impact into the substrate 2 (which may be termed the bulk) of the device (as indicated by the arrow j) and gain energy from the drain to bulk voltage.

As a result of this gain in energy, electron-hole pairs are created in the bulk by a second impact ionization event. Because the physical position where this second impact ionization occurs depends on a number of parameters such as, for example, the energy of the first-impact carriers, their diffusion life-time, the bulk doping concentration, and the doping profile and depth of the drain junction; an exact impact position for the carriers may not be determined. Thus, the impact location is described in terms of an impact region. The impact region is indicated by the cloud k in FIG. 1. "Second-impact carriers", which, for this embodiment are electrons, are created as a result of the second impact ionization event. These second-impact carriers (electrons) will be attracted towards the gate 5 by the gate voltage and will be injected near the drain 4 side of the memory device into the dielectric stack comprising the charge-storing dielectric layer 8 (indicated by the arrows l).

Because of the distributed (and statistical) nature of this process, as is indicated by the cloud k, the second-impact carriers will not be injected into the dielectric stack at one single position along the channel, as would be the case for classical hot-electron-injection. For the exemplary embodiment, carriers are injected at a statistically distributed set of points along the channel 10. The programming mechanism employed in this embodiment places electrical carriers on the second (charge storing) dielectric layer 8 using a non-localized injection of hot carriers, which are generated by a secondary impact ionization mechanism that takes place in the bulk (the substrate 2) of the device. Instead of having the majority of the injected carriers stored at substantially the same location in the dielectric stack 6a, the injected carriers are distributed over a region within the dielectric stack 6a. This carrier distribution region may be approximated using the statistics of the overall carrier generation process.

Because the primary electrons involved in the fist impact ionization event will only need to gain enough energy to generate the first-impact carriers; a lower voltage difference between the source 3 and the drain 4 than is typical may be applied. In this respect, because the first-impact carriers must gain enough energy to generate second-impact carriers; a moderate voltage difference between the drain 4 and the substrate 2 is applied. The voltage from the gate 5 to the substrate 2 must be large enough for the second-impact carriers to gain sufficient energy to cross the substrate-dielectric energy barrier. If oxide is used as for the first dielectric layer 7 then this energy barrier is approximately 3.2 eV for electrons and approximately 4.8 eV for holes.

In a typical current memory device, the injected charge is stored on a conductive floating gate and not on a non-conductive charge-storing dielectric layer 8, such as in the exemplary memory cell 1 shown in FIG. 1. In order to attract the generated carriers towards a conductive floating gate, a relatively high voltage (as compared to a logic supply voltage) is applied to a control gate. This high voltage is needed because only a part of this gate voltage will be available at the floating gate due to the capacitive divider that is formed between the substrate, the floating gate and the control gate electrode. For the exemplary memory device (shown in FIG. 1), such a capacitive divider is not present, which allows for the use of a lower gate to substrate voltage.

For the exemplary programming method, the difference in the absolute values of the first and second voltages being applied, respectively, to the drain 4 and gate 5 during programming may be 1.5 V or less, or 1 V or less. Further, the difference in absolute value of the first, second and third voltages being applied, respectively, to the drain 4, gate 5 and bulk (the substrate 2) during programming may also be 1.5 V or less, or 1 V or less. In this regard, the absolute value of the first, second and third voltages being applied respectively to the drain, gate and bulk (the substrate 2) during programming, for an exemplary embodiment, are approximately equal. Depending on the particular embodiment, this absolute value may be 5 V or less, or may be 4.5V or less.

Figure 2:
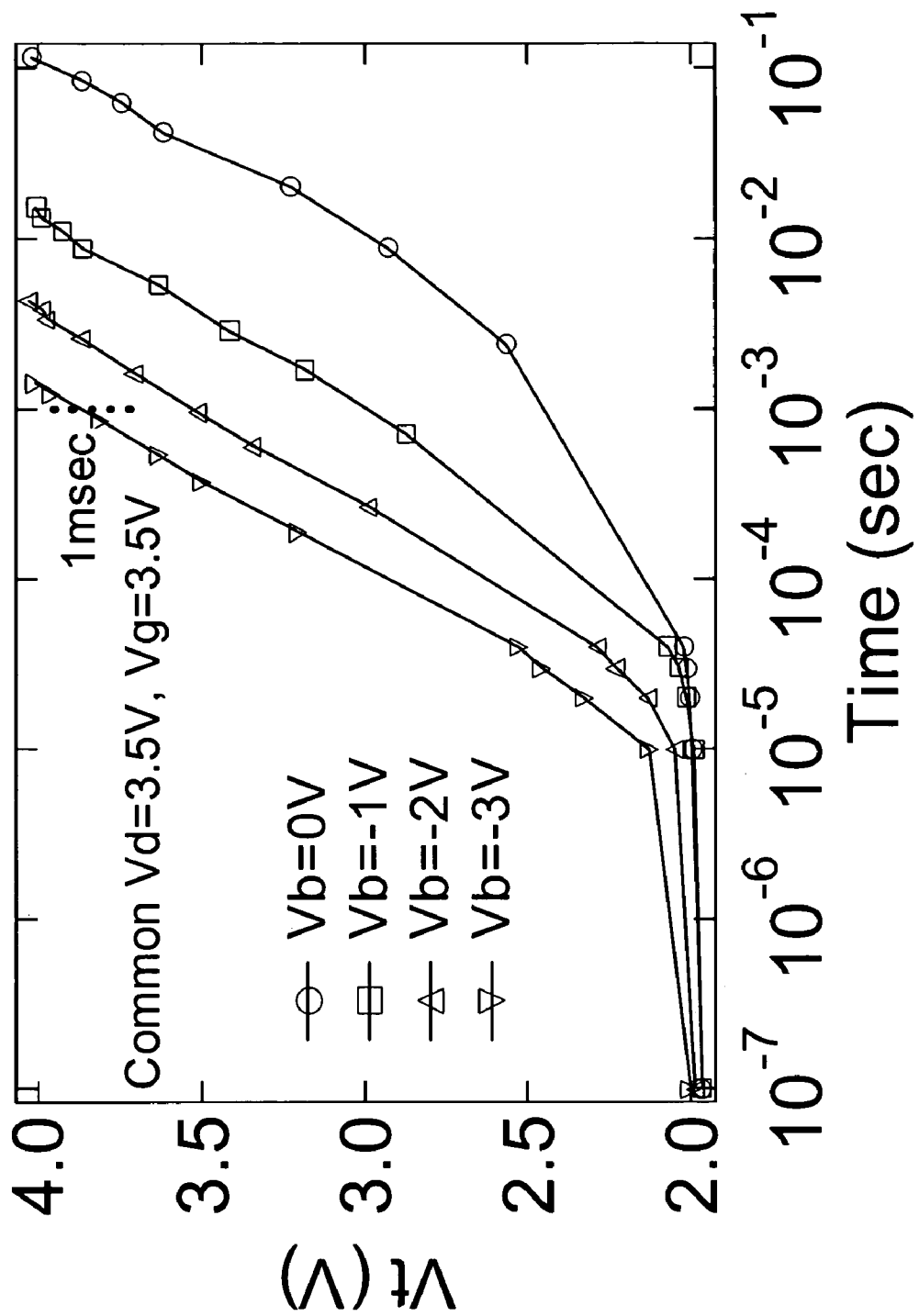
FIG. 2 is a graph illustrating programming characteristics of a device in accordance with an embodiment of the invention.

Referring now to FIG. 2, a graph is illustrated that shows the shift (V) in threshold voltage Vt of the programmed memory cell as a function of programming time (in seconds) using an exemplary method at four different substrate bias values (Vb=0 V, −1 V, −2 V and −3 V) for biasing the bulk (the substrate 2). The results shown in FIG. 2 are for a memory cell biased with a drain voltage (Vd) and gate voltage (Vg) of 3.5V, while the source voltage (Vs) is 0 V or electrical ground. For this embodiment, Vd and Vg are positive in polarity, while Vb is zero or negative in polarity. As may be seen in FIG. 2, increasing the negative bulk bias results in improvements in programming efficiency. This improved efficiency is evidenced by the fact that the threshold voltage shift (Δ Vt) after a given programming time, e.g. 1 msec, becomes larger with increasing (negative) bulk bias. The substrate bias thus contributes to the generation and/or acceleration of hot electrons near the drain junction. Therefore, the programming mechanism of the present invention may be termed substrate-enhanced-hot-electron (SEHE) injection. One aspect of this programming mechanism is that, contrary to the conventional channel-hot-electron (CHE) injection mechanism, carriers are not injected into the dielectric stack 6a at a well-defined position. The injection of the carriers according to the present invention is a non-local injection phenomenon, with scattered injection behavior.

Figure 3:
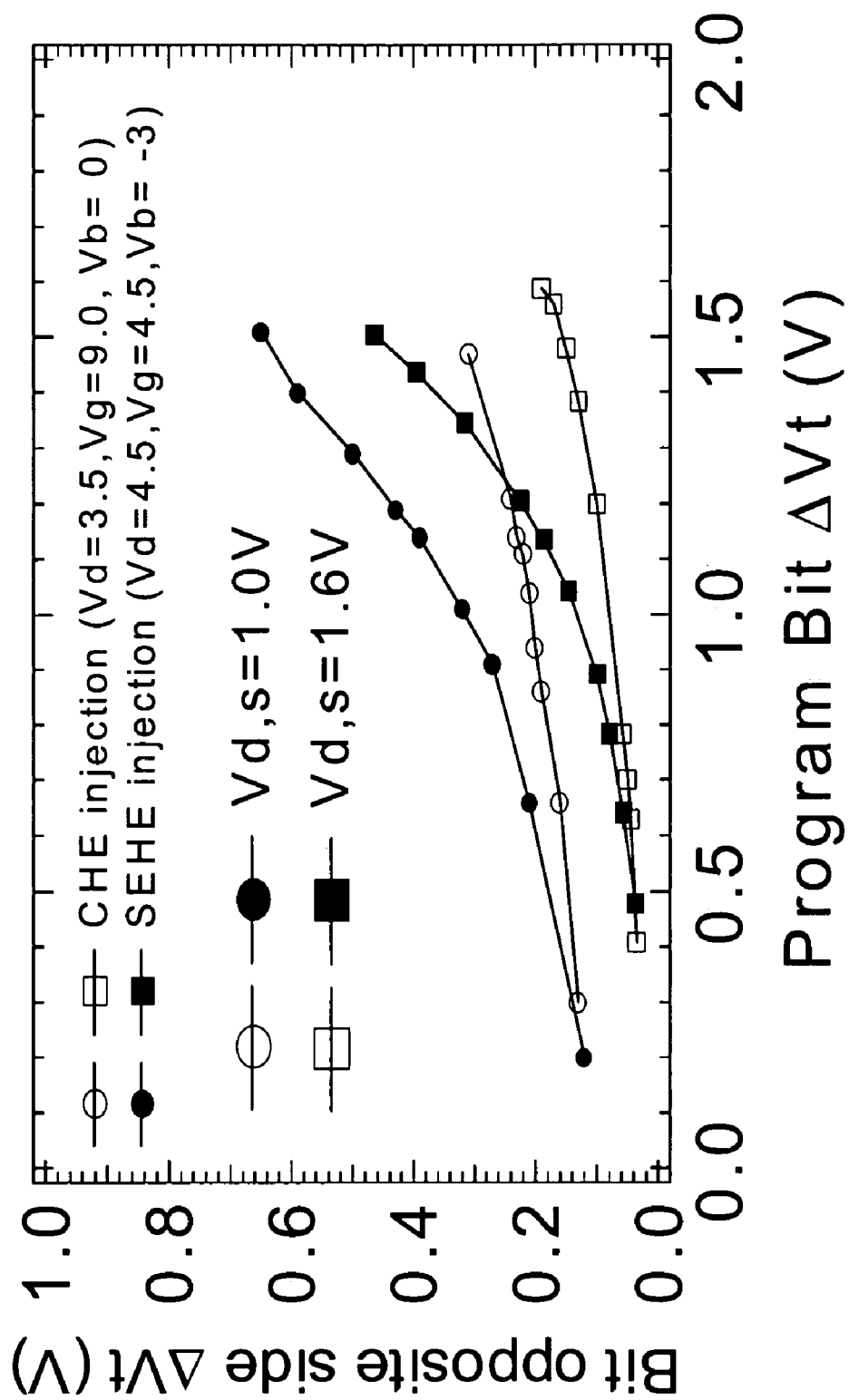
FIG. 3 is a graph illustrating a comparison of bit-to-bit interference for a current device and a device in accordance with an embodiment of the invention.

Referring now to FIG. 3, a graph is shown that illustrates the difference between an exemplary embodiment employing SEHE injection and embodiments employing CHE injection that demonstrates the spread of the injection position when programming the device of FIG. 1. In this regard, when programming the drain side ("Program Bit") of a memory device according to the exemplary method using SEHE injection and a method using CHE injection, the change in threshold voltage Δ Vt at the source side of the memory device, ("Bit opposite side"), of the transistor is monitored. After programming, the two bits were read (the shift in threshold voltage was measured) at two read voltage (drain to source voltage (Vds)) values of 1 V and 1.6 V.

As may be seen in FIG. 3, for a cell programmed using conventional CHE injection, only a small shift in the threshold voltage at the source side is observed. Current memory devices (e.g., those described in PCT application WO 99/07000) utilize this aspect of CHE injection to produce dual bit memory devices, in which two bits of data are stored, one at each of the two extreme positions of the floating gate (e.g., drain and source).

As may also be seen in FIG. 3, using SEHE injection, a larger shift in threshold voltage at the source side is observed for a given shift in threshold voltage at the drain side, indicating interference between the two extreme positions in the floating gate. Even when a read voltage of Vds=1.6V is used at the source side to read the bit at the drain side, the increased threshold voltage at the source side is no sufficiently masked. This situation is alleviated in the exemplary embodiment by only storing a single bit of data in the memory cell 1. As a result, the disclosed efficient, low voltage, programming mechanism may be used. The single bit device of the exemplary embodiment has an asymmetric charge storage mechanism. That is, charge is stored from the drain side of the device but is not located at the drain side only. As the memory cell is programmed from the drain side and read from the source side, a lower bit line read voltage, e.g. 1V, compared to the read voltage, e.g. 1.5V of the two-bit memory device described in PCT patent application WO 99/07000 may be used. The higher read-out voltage, for such embodiments, is required to extend the depletion region of the junction to mask the neighboring bit that is not being read out. However, this higher read-out voltage might result in a so-called soft write error. A soft write error occurs when carriers from the read-out current (voltage potential) gain enough energy to be injected into the area of the memory device storing masked bit and, thus, add unwanted charge to the floating gate, which may eventually change the bits logical state.

Another advantage of the exemplary embodiments is that further scaling (reduction) of the channel length does not result in an increase in bit-to-bit interference as would occur in prior embodiments. This is due to the fact that only one bit of information is programmed for each memory cell. For two-bit memory cells, scaling the channel length brings the two extreme positions of the floating gate closer together, which results in interference between the two bits stored at these positions being more likely. Programming only a single bit of information, as is discussed herein, allows for further scaling of the exemplary devices. Furthermore, the exemplary methods allow for lower operating voltages, which, in turn, allows for reduction (scaling) of device dimensions. In this respect, the lower the operating voltages used, the closer the source and drain junctions may be without resulting in breakdown (e.g. avalanche breakdown).

Exemplary Method for Erasing a Memory Cell

An exemplary method for erasing a single gate non-volatile memory cell, such as the memory cell 1 described above, comprises erasing the memory cell from the drain side. The cell is erased by applying a first voltage of a first polarity to the drain 4, a second voltage of a second opposite polarity to the gate 5, and a third voltage of the second polarity to the substrate 2 (e.g., the bulk). In the exemplary method, the source 3 is biased to 0 V, or electrical ground. The erasing mechanism uses injection of hot carriers into the charge storing dielectric layer 8 near the drain 4 of the memory cell 1. These carriers will be of an opposite type than the carriers used for programming. For this particular embodiment, as electrons are injected during programming, holes are injected during erasing.

Erasing of the exemplary memory cell 1 using the exemplary method comprises applying a negative voltage to the gate 5, such that the drain 4 is put into deep depletion and "cold" holes are generated by band-to-band tunneling between the drain 4 and the channel 10. These "cold" holes gain sufficient energy from the surface lateral electrical field (in the channel) to become hot and to cross the substrate-dielectric energy barrier. If oxide is used as the first dielectric layer 7 the energy to cross the barrier is approximately 4.8 eV (for holes as was indicated above). When erasing a memory cell in accordance with the exemplary method, the gate to drain voltage should be such that a deep depletion region is formed at the drain side of the memory device. This allows for band-to-band tunneling of the carriers used for erasing (e.g. holes for this embodiment) between the drain 4 and channel 10. Further, the gate to substrate voltage must be large enough for these carriers to gain sufficient energy to become hot and cross the substrate-dielectric energy barrier.

For the exemplary method of erasing a memory cell, the difference in absolute values of the first, second and third voltages being applied, respectively, to the drain, gate and bulk during programming may be 1.5 V or less, or 1 V or less. Further, in an exemplary embodiment, the absolute values of the first, second and third voltages being applied during erasing are approximately the same value. In the exemplary embodiment, this absolute value may be 5 V or less, or may be 4.5 V or less. In an exemplary embodiment for erasing the memory cell 1, the drain 4 is biased to 3.5 V, the gate 5 to −3.5 V while the substrate 2 is biased to −3 V and the source 3 is biased to 0 V (e.g., electrical ground).

Figure 4:
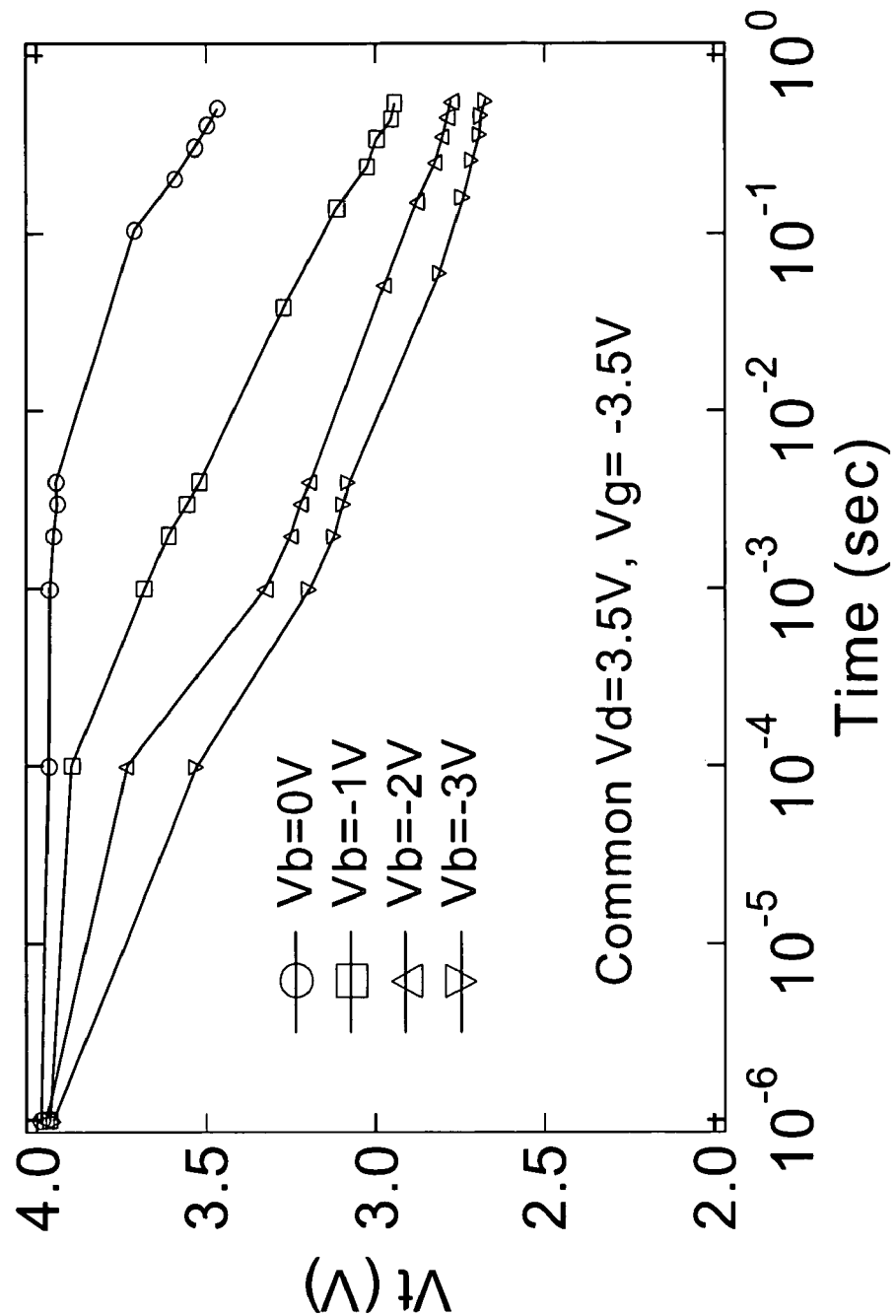
FIG. 4 is a graph illustrating erase characteristics of a device in accordance with an embodiment of the invention.

Referring now to FIG. 4, a graph is illustrated that shows the shift in threshold voltage Vt of the erased memory cell as a function of time (sec) for four different substrate (bulk) bias voltage values (Vb=0, −1, −2, −3V) at a given drain voltage (Vd) of 3.5V, gate voltage (Vg) of −3.5V, and source voltage (Vs) of 0 V or electrical ground. For this embodiment, the first voltage has a positive polarity, the second voltage has a negative polarity, and the third voltage is zero or has a negative polarity. As may be seen in FIG. 4, a more negative bulk bias results in an improved erase efficiency, as the threshold voltage after a given erase time becomes smaller with increasing bulk bias at a given Vd, Vg and Vs. This is due, in part, to the fact that the substrate bias contributes to the generation and/or acceleration of hot holes near the drain junction. Thus the erasing mechanism of the exemplary embodiment may be referred to as substrate-enhanced-band-to-band-tunneling-induced-hot-hole (SEBBHH) injection.

For the exemplary erase method, applying a negative bias to the bulk (the substrate 2) enhances the surface lateral electrical field in the channel 10 of the memory device 1. The "cold" holes generated by surface band to band tunneling gain energy from this enhanced lateral field, become "hot" and are injected into the dielectric stack 6a. Since the erase method is based on the injection of hot carriers, the erase efficiency is independent of the thickness of the bottom oxide. Thus, an advantage of the exemplary erasing method is that the bottom oxide does not need to be thickness scaled (e.g., reduced) to allow for erasing, but may be kept relatively thick in order to maintain good charge retention capabilities.

Additional Experimental Results

Figure 5:
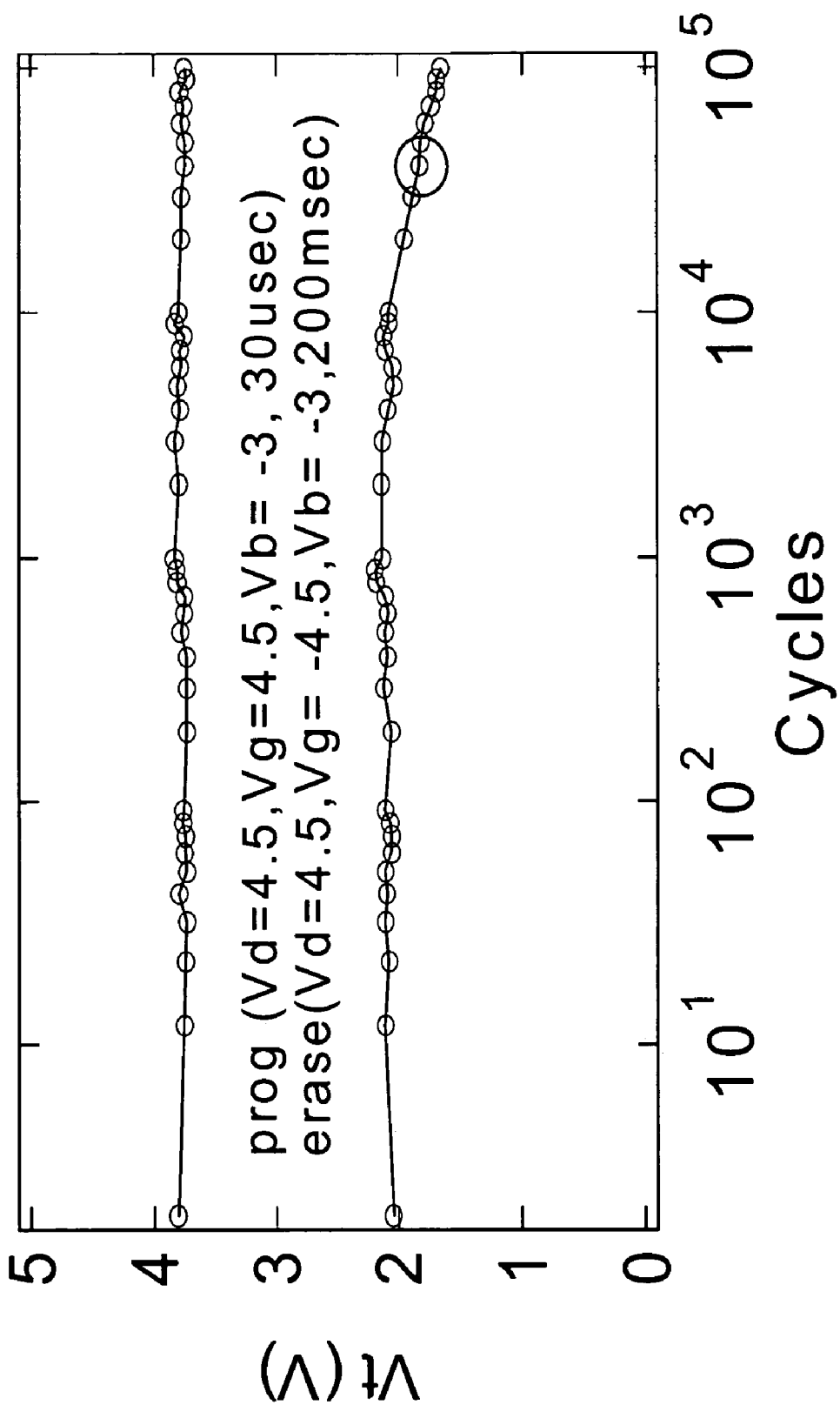
FIG. 5 is a graph illustrating endurance characteristic of a memory device programmed and erased in accordance with an embodiment of the invention.

Referring to FIG. 5, a graph is illustrated that shows the endurance characteristics of the cell programmed and read according to embodiments of the invention. Endurance may be defined as the number of program and erase cycles a memory cell may undergo and still operate properly. As may be seen in FIG. 5, an exemplary memory cell has an "endurance" of more than 100,000 cycles.

Figure 6:
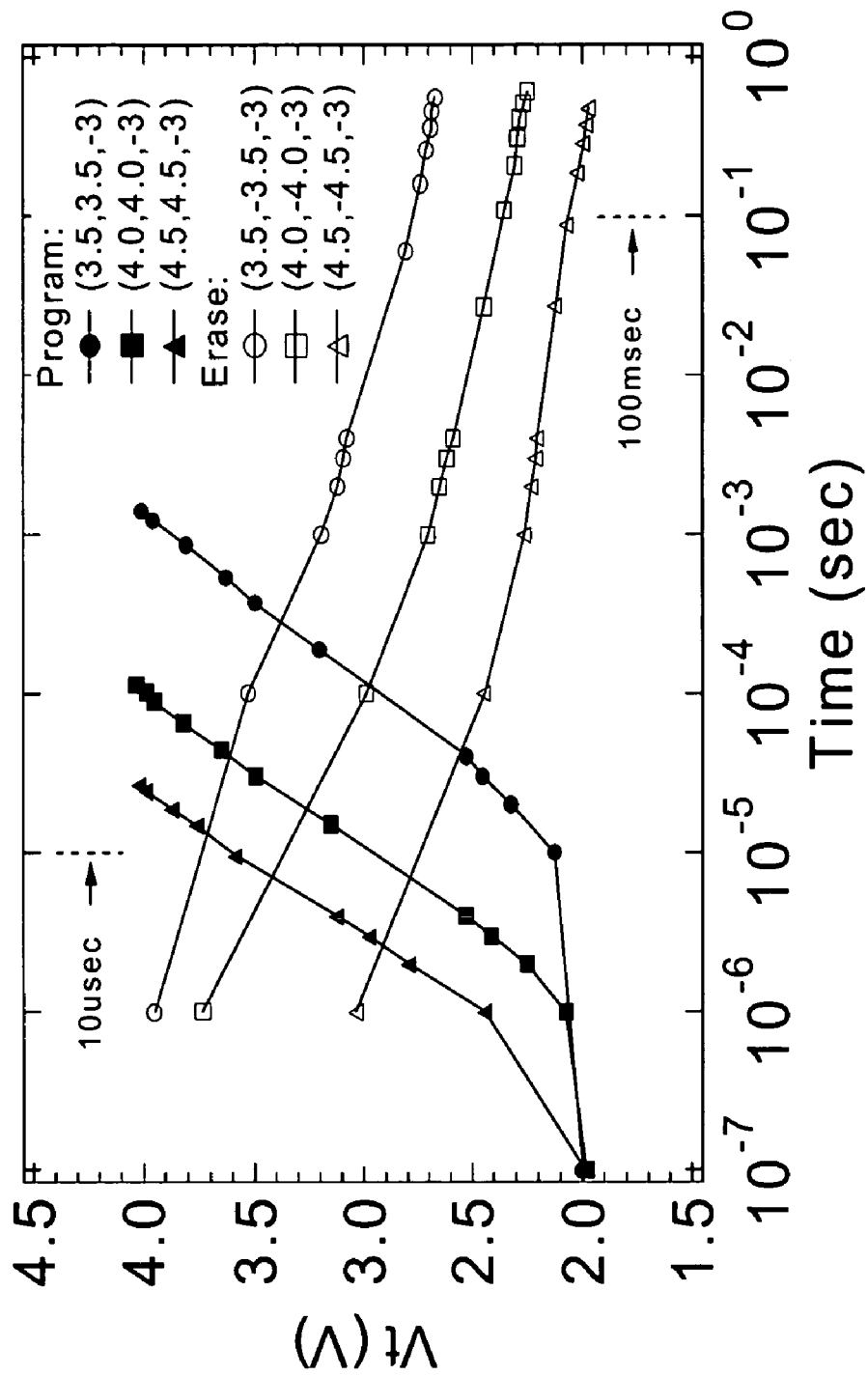
FIG. 6 is a graph illustrating cell performance for memory devices programmed and erased in accordance with embodiments of the invention.

FIG. 6 is a graph that illustrates the voltage window for programming and erasing the exemplary single bit memory device. As may be seen in FIG. 6, the time window studied was that between 10 usec and 100 msec using the exemplary methods for programming and erasing. The threshold voltage (Vt) is shown as a function of time (sec) for three different sets of drain voltage (Vd), gate voltage (Vg) and bulk voltage (Vb).

Exemplary Memory Array Configuration

Figure 7:
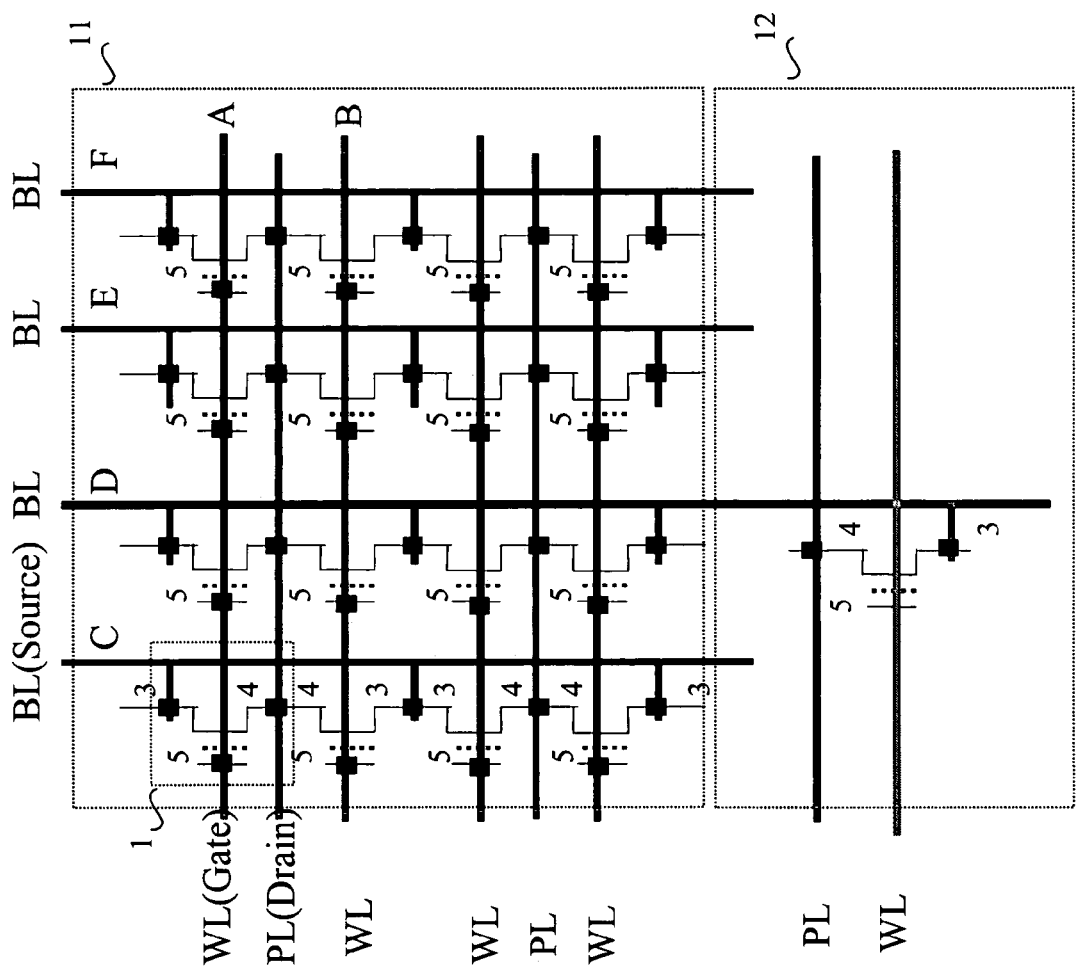
FIG. 7 is a schematic circuit diagram illustrating a memory array configuration for memory devices in accordance with an embodiment of the invention.

FIG. 7 is a schematic drawing that illustrates an exemplary embodiment of a memory cell array configuration for memory devices, such as the memory device 1. As may be seen in FIG. 7, such a memory array comprises several sectors. In this regard, black squares in FIG. 7 indicate a connection between a metal line (e.g. wordline (WL), bitline (BL), program line (PL)), and a memory device terminal (e.g. source 3, drain 4 or gate 5). In one of the illustrated sectors, the NOR-type memory array architecture according to one embodiment of the invention is shown. In the memory array shown in FIG. 7, the memory cells are organized in columns.

As may also be seen in FIG. 7, adjacent memory cells in each column have either their drains 4 or their sources 3 in common (e.g. a given memory cell will have the source 3 in common with a memory cell on one side and the drain node 4 in common with the memory cell on its opposite side). The drains 4 of two adjacent memory cells in each column are coupled, as indicated by the black squares in FIG. 7, to form a PL that runs perpendicular to the cell column. For this embodiment, the PL is formed in a first interconnect layer of metal coupled via contacts or vias to the drains 4.

As is also shown in FIG. 7, the memory devices are mirrored with respect to the PL metal. The sources 3 of the memory cells 1 in each column are coupled to form a BL running parallel to the corresponding cell column. For this embodiment, the BL is formed in a second, higher, interconnect layer of metal coupled via contacts or vias to the sources of each memory cell. Further, the gates 5 of each memory cell 1 at identical horizontal positions in each column are coupled by a word line (WL) running perpendicular to the cell column. In an exemplary embodiment, this word line is formed with polycrystalline silicon, which is also used to form the gate 5 of each memory cell. Thus, the WLs and PLs are arranged in parallel for the embodiment shown in FIG. 7. Furthermore, the memory array shown in FIG. 7 is a contacted array as the sources 3, drains 4 and gates 5 of each of the individual memory cells 1 is contacted. In this arrangement, a memory cell 1 is located at each intersection of a WL and a BL.

One advantage of the memory cell array shown in FIG. 7 is that the peak voltage seen within one sector 11 at the drain 4 and the gate 5 of each memory cell can be limited. Such limiting is advantageous as it may improve the program disturb margin for the memory cell array. For the memory array of FIG. 7, program inhibit may be used to prevent unwanted programming of memory cells. For example, if the memory cell 1 at the intersection of column C and row A is to be programmed, the cells in row A belonging to the other columns D, E, F will be exposed to the programming drain and gate voltages. To prevent unwanted programming of these cells, the respective other BLs (D, E, F, etc.) will be biased, for this embodiment, to a positive voltage. Because the BLs are common between the sector 11 (the upper sector) and the sector 12 (lower sector), the memory cells of sector 12 will be exposed to the programming voltage at their sources 3, which might cause disturbance within these cells (e.g., such as corrupting previously programmed cells). However, due to the low programming voltage (e.g. less than 4.5V in the examples given above) the inhibit voltage applied at the source 3 of the memory cells in column D may also be low.

Figure 8:
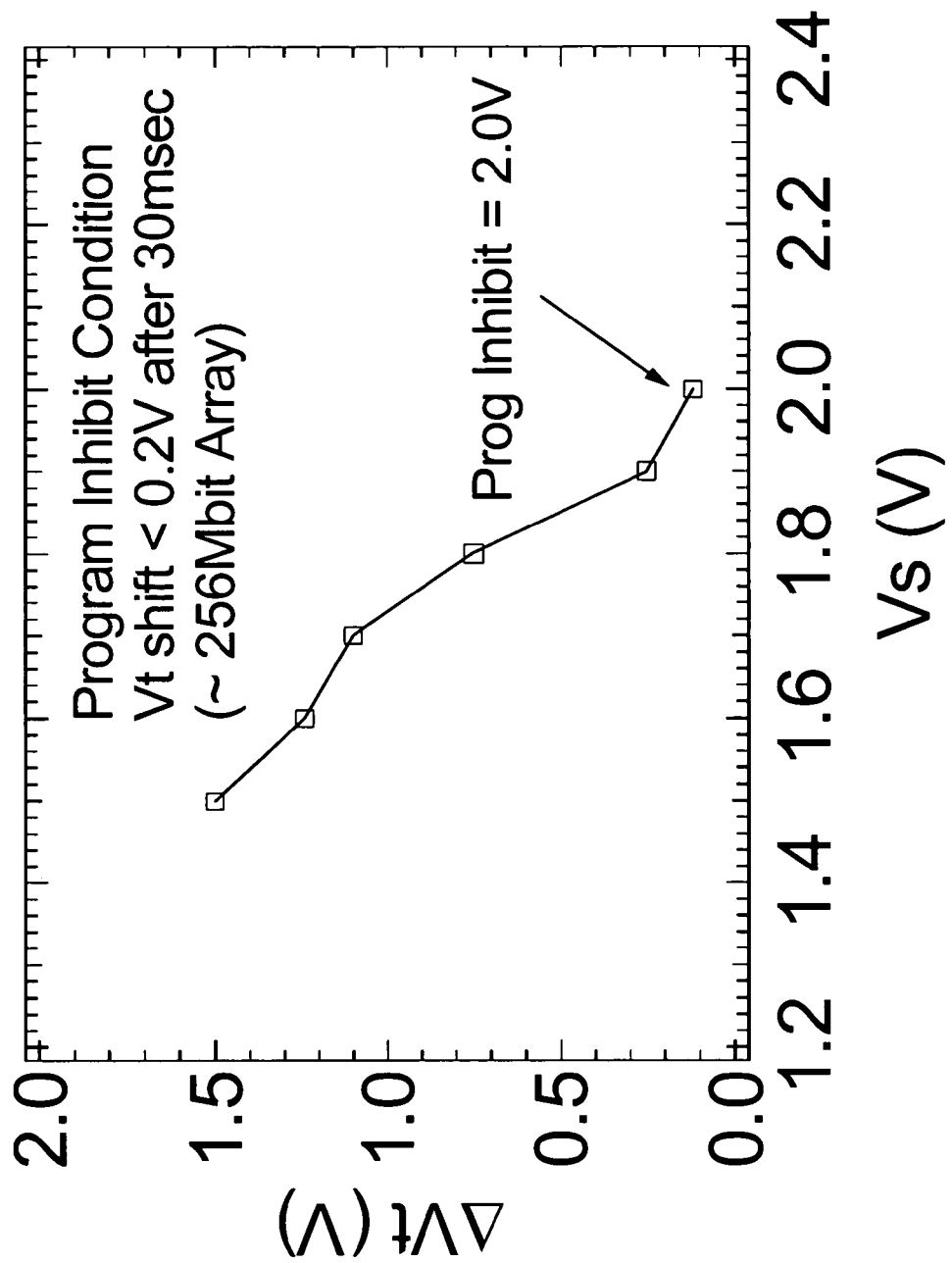
FIG. 8 is a graph illustrating program inhibit behavior of a memory architecture in accordance with an embodiment of the invention.

Because, as shown in FIG. 7, the BL coupling the source 3 of a column is common to all sectors, the bias applied to the this bit line will be seen by all memory cells in each sector sharing this bit line. Therefore, if the source inhibit voltage is too high, this may introduce program disturb across other sectors. However, in an exemplary embodiment, a source inhibit voltage (Vs) of 2V would be sufficient to prevent a significant shift in threshold voltage Vt, as its illustrated in FIG. 8 is a graph that shows threshold voltage shift decreases as a function of the source voltage. In this regard, a threshold shift of less than 200 mV may be observed for bias times upwards of 30 seconds. In a 256 Mbit array, arranged in a 16K×1K word configuration, the program time of the memory array is approximately 20 milliseconds (msec): 1K word×20 usec/cell. The disturb time, i.e. the time during which cells of the mirror row are exposed to the program voltage of the adjacent row, would equal the program time of the memory array. The performance illustrated in FIG. 6 indicates that the disturb margin is more than sufficient for 30 second programming bias times.

CONCLUSION

Exemplary arrangements of the present invention have been described herein. It will be appreciated, however, that those skilled in the art will understand that changes and modifications may be made to these arrangements without departing from the true scope and spirit of the present invention, which is defined by the following claims.

We claim:

1. A memory circuit, comprising:
an array of single bit nonvolatile memory cells organized in columns, wherein each of the memory cells comprises a semiconductor substrate including a source, a drain, and a channel in-between the source and the drain; and a control gate that comprises a gate electrode and a dielectric stack, the gate electrode being separated from the channel by the dielectric stack, the dielectric stack comprising at least one charge storage dielectric layer, wherein:
   adjacent memory cells in each column of the memory circuit have one of their sources and their drains in common;
   the sources of the memory cells in each column of the memory circuit are coupled with the same bitline, the bitline running parallel with the column;
   the drains of the memory cells in each column of the memory circuit are coupled with a respective program line, the program line running perpendicular to the column; and the gates of the memory cells in each column of the memory circuit are coupled with a respective word line, the word line running perpendicular to the column, wherein programming a memory cell of the memory circuit comprises:

applying electrical ground to a first bitline;

applying a first voltage having a first polarity to a wordline;

applying a second voltage of the first polarity to a program line;

applying a third voltage, having a second polarity opposite to the first polarity to the semiconductor substrate; and applying a fourth voltage of the first polarity to all other bitlines of the memory circuit.

2. The memory circuit of claim 1, wherein absolute values of each of the first, second and third voltages are 5 V or less, and an absolute value of the fourth voltage is 2 V or less.

* * * * *